United States Patent
Lee

(10) Patent No.: US 6,798,703 B2
(45) Date of Patent: Sep. 28, 2004

(54) SEMICONDUCTOR MEMORY DEVICE HAVING IMPROVED REPLACEMENT EFFICIENCY OF DEFECTIVE WORD LINES BY REDUNDANCY WORD LINES

(75) Inventor: Hi-choon Lee, Yongin (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/348,752

(22) Filed: Jan. 23, 2003

(65) Prior Publication Data

US 2004/0022093 A1 Feb. 5, 2004

(30) Foreign Application Priority Data

Aug. 2, 2002 (KR) .................................. 10-2002-0045892

(51) Int. Cl.$^7$ .................................................. G11C 7/00
(52) U.S. Cl. ................................. 365/200; 365/230.03
(58) Field of Search ........................... 365/200, 230.03

(56) References Cited

U.S. PATENT DOCUMENTS

| 6,052,318 | A | * | 4/2000 | Kirihata et al. | ............. 365/200 |
| 6,058,053 | A | * | 5/2000 | Tsuji et al. | ................. 365/200 |
| 6,084,807 | A | * | 7/2000 | Choi | ........................... 365/200 |
| 6,567,322 | B1 | * | 5/2003 | Mukai et al. | ................ 365/200 |

* cited by examiner

*Primary Examiner*—Son Mai
(74) *Attorney, Agent, or Firm*—Harness, Dickey & Pierce, P.L.C.

(57) ABSTRACT

A semiconductor memory device that efficiently replaces defective word lines by redundancy word lines. The semiconductor memory device includes a plurality of banks, each bank having a plurality of normal word lines and a plurality of redundancy word lines. A defective word line can be replaced by the redundancy word lines when defects occur in the normal word lines. When word line defects occur, redundancy word lines banks adjacent to the bank having the defective work lines may be used.

19 Claims, 4 Drawing Sheets

SEMICONDUCTOR MEMORY DEVICE HAVING IMPROVED REPLACEMENT EFFICIENCY OF DEFECTIVE WORD LINES BY REDUNDANCY WORD LINES

This application claims the priority of Korean Patent Application No. 2002-45892, filed Aug. 2, 2002, in the Korean Intellectual Property Office, the contents of which are incorporated herein in its entirety by reference.

BACKGROUND OF THE INVENTION

1. Field of the Invention

The present invention generally relates to a semiconductor memory device, and more particularly, to a semiconductor memory device having improved replacement efficiency of defective word lines by redundancy word lines in a semiconductor memory device having a plurality of banks.

2. Description of the Related Art

In semiconductor memory devices, in particular, in Dynamic Random Access Memories (DRAMs), the concept of a bank is introduced to increase the efficiency of data access time, which is known as an access time tAC. A bank is one or a plurality of DRAM blocks sharing timing control signals. Memories in a bank share a data bus, an address, and a control signal line. However, each bank is an independent chip that has a row decoder and a column decoder. An inherent DRAM operation can be performed in each bank.

Because banks are independent, while data are read in one bank, a pre-charge or refresh operation is performed, or a word line selection operation using a new row address can be performed in another bank. Accordingly, if an operation of selecting word lines is performed in another bank while data are read from a sense amplifier of one bank, a row access time of a DRAM can be reduced greatly. Therefore, a time loss can be reduced by increasing the number of banks.

However, if the number of banks is increased in a redundancy circuit, which is used to replace a defective memory cell with an operational memory cell, redundancy efficiency is reduced as a result of the increase in the number of banks.

FIG. 1 shows a conventional semiconductor memory device 1000 having a plurality of banks. As shown in FIG. 1, the semiconductor memory device 1000 includes a plurality of banks 100, 101, 102, 103, and 104, a plurality of sense amplifiers 110, 111, 112, and 113 placed between one bank and another bank, a plurality of switching circuits 120, 121, 122, 123, 124, 125, 126, and 127 placed between a bank and a sense amplifier, and control circuits 131, 132, and 133.

Referring to FIG. 1, if a second bank 102 is activated, sense amplifiers 111 and 112 that are adjacent to the second bank 102 operate. Therefore, a first bank 101 and a third bank 103 can be activated. Accordingly, the first bank 101 and the third bank 103 cannot use the respective sense amplifiers 111 and 112. A bank 100 and a fourth bank 104 are not adjacent to the activated second bank 102, and thus can be activated together with the second bank 102.

Accordingly, if a word line fault occurs in the second bank 102, the defective word line cannot be replaced by redundancy word lines of the first bank 101 and the third bank 103 adjacent to the second bank 102.

Assuming one block is used as one bank, if a defective word line occurs in the bank, the defective word line should be replaced only by redundancy word lines of the bank. Thus, the bank must include a significant number of redundancy word lines so as to obtain an adequate yield. The significant number of redundancy word lines necessarily increases the size of a semiconductor memory chip.

SUMMARY OF THE INVENTION

An exemplary embodiment of the present invention provides a semiconductor memory device have redundancy efficiency, in which a defective word line may be restored using redundancy word lines of two adjacent banks.

One exemplary embodiment of the present invention provides a semiconductor memory device having a plurality of banks, where each bank includes a plurality of normal word lines and a plurality of redundancy word lines. The redundancy word lines are used to replace a defective word line if required.

The exemplary embodiment further includes a plurality of sense amplifiers, where each of the plurality of sense amplifiers is placed between one adjacent bank and another adjacent bank. The sense amplifiers sense and amplify data on a bit line of a respective bank. In addition, a plurality of switching circuits are provided, where each switching circuit is placed between a bank and a sense amplifier. The switching circuits are capable of transmitting data on a bit line of a bank to a sense amplifier in response to a control signal, which is generated by a control signal generator.

When defects occur in the normal word lines of the bank, they are replaced by redundancy word lines of two banks adjacent to the bank. The control signal is used to disable the switching circuits connected to the bank containing the defective word lines. Moreover, the control signal is used to enable each of the switching circuits placed between the bank and each of the adjacent banks, and between the bank and each of the adjacent sense amplifiers. The defective word lines of the bank are replaced by the redundancy word lines of the two banks adjacent to the bank by enabling the redundancy word lines of the two banks adjacent to the bank.

In an exemplary embodiment, when the defected word line of the bank is replaced by the redundancy word lines of the bank, the control signal is used to enable the switching circuits connected to the enabled bank and disable the switching circuits connected to the banks adjacent to the bank.

According to an exemplary embodiment of the present invention, there is provided a semiconductor memory device. The semiconductor memory device includes a plurality of banks, each having normal word lines and redundancy word lines, and a plurality of sense amplifiers, each of which is placed between one adjacent bank and another adjacent bank. The sense amplifiers sense and amplify data on a bit line of each bank.

When a word line becomes defective as a result of a defect in the normal word lines of a bank, it is replaced by redundancy word lines of those banks adjacent to the bank having the defective word line. The redundancy word lines, as required, of each of the banks adjacent to the bank are simultaneously enabled, and each of the sense amplifiers placed between the bank and each of the banks adjacent to the bank senses and amplifies data of redundancy word lines of each of the banks adjacent to the bank.

Furthermore, according to an embodiment of the present invention, there is provided a semiconductor memory device. The semiconductor memory device includes a plurality of banks, each having normal word lines and redundancy word lines. The device further includes a plurality of sense amplifiers, each of which is placed between one adjacent bank and another adjacent bank, which senses and amplifies data on a bit line of each bank, and a plurality of switching circuits, each of which is placed between each bank and each sense amplifier, which transmits the data on the bit line of the bank to the sense amplifier in response to a control signal. Moreover, a control signal generator is provided that generates the control signal.

When a word line becomes defective as a result of a defect in the normal word lines of a bank, it is replaced by redundancy word lines of each of the banks adjacent to the bank. The redundancy word lines of each of the banks adjacent to the bank are simultaneously enabled, and a corresponding switching circuit transmits data of the redundancy word lines of each of the banks adjacent to the bank to a corresponding sense amplifier in response to a corresponding control signal.

Moreover, according to an embodiment of the present invention, there is provided a semiconductor memory device. The semiconductor memory device includes a first bank having normal word lines and redundancy word lines and second and third banks adjacent to the first bank in both directions, first and second sense amplifiers, each of which is placed between the first bank and the second bank and between the first bank and the third bank, connected to bit lines of each of the first through third banks, senses and amplifies data. Furthermore, first, second, third, and fourth switching circuits are provided, each of which is connected between the second bank and the first sense amplifier, between the first sense amplifier and the first bank, between the first bank and the second sense amplifier, and between the second sense amplifier and the third bank. The switching circuits are for connecting each of the banks to each of the sense amplifiers in response to a control signal, which is generated by a control signal generator and is used to control the first through fourth switching circuits.

When a word line becomes defective as a result of a defect in the normal word lines of a bank, it is replaced by redundancy word lines of the second and third banks. The control signal is used to disable the second and third switching circuits and is used to enable the first switching circuit and the fourth switching circuit, and the defected word line of the first bank is replaced by the redundancy word lines of the second and third banks by simultaneously enabling the redundancy word lines of the second and third banks.

In an exemplary embodiment of the present invention, when the defected word line of the first bank is replaced by the redundancy word lines of the first bank, the control signal is used to enable the second and third switching circuits and disable the first and fourth switching circuits.

In an exemplary embodiment of the present invention, there is provided a semiconductor memory device. The semiconductor memory device includes first, second, and third banks, each having normal word lines and redundancy word lines, a first sense amplifier which is placed between the first bank and the second bank, which senses and amplifies data on bit lines of the first and second banks in response to a first corresponding control signal. Moreover, the semiconductor device includes a second sense amplifier which placed between the first bank and the third bank, which senses and amplifies data on bit lines of the first and third banks in response to a second corresponding control signal.

When a word line becomes defective as a result of a defect in the normal word lines of a bank, it is replaced by redundancy word lines of the second and third banks, the redundancy word lines of the second bank and the redundancy word lines of the third bank are activated, the first sense amplifier senses and amplifies data of the redundancy word lines of the second bank in response to the first control signal, and the second sense amplifier senses and amplifies data of the redundancy word lines of the third bank in response to the second control signal.

The semiconductor device may further include a fourth bank adjacent to the second bank, having normal word lines and redundancy word lines, a fifth bank adjacent to the third bank, having normal word lines and redundancy word lines, a third sense amplifier which is placed between the second bank and the fourth bank, senses and amplifies data on bit lines of the second and fourth banks in response to a third corresponding control signal, and a fourth sense amplifier which is placed between the third bank and the fifth bank, senses and amplifies data on bit lines of the third and fifth banks in response to a fourth corresponding control signal. The third and fourth sense amplifiers are deactivated in response to the third and fourth control signals.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE EXEMPLARY EMBODIMENTS

Figure 1:
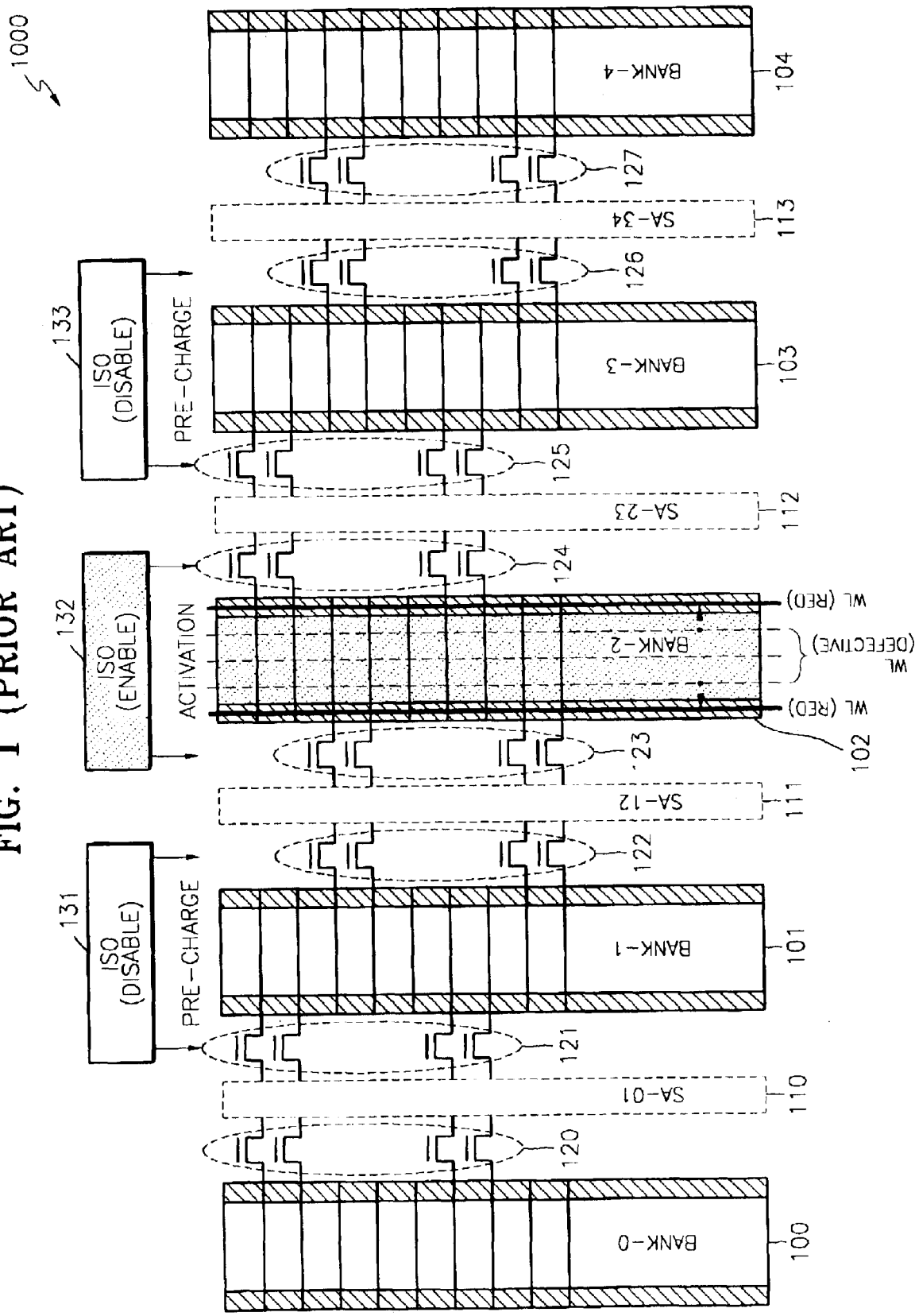
FIG. 1 shows a conventional semiconductor memory device having a plurality of banks.

The present invention will be described more fully hereinafter with reference to the accompanying drawings in which exemplary embodiments of the invention are shown. Hereinafter, the present invention will be described in detail by describing exemplary embodiments of the invention with reference to the accompanying drawings. Like reference numerals refer to like elements throughout the drawings. The exemplary embodiments described herein are not considered as limiting the present invention.

Figure 2:
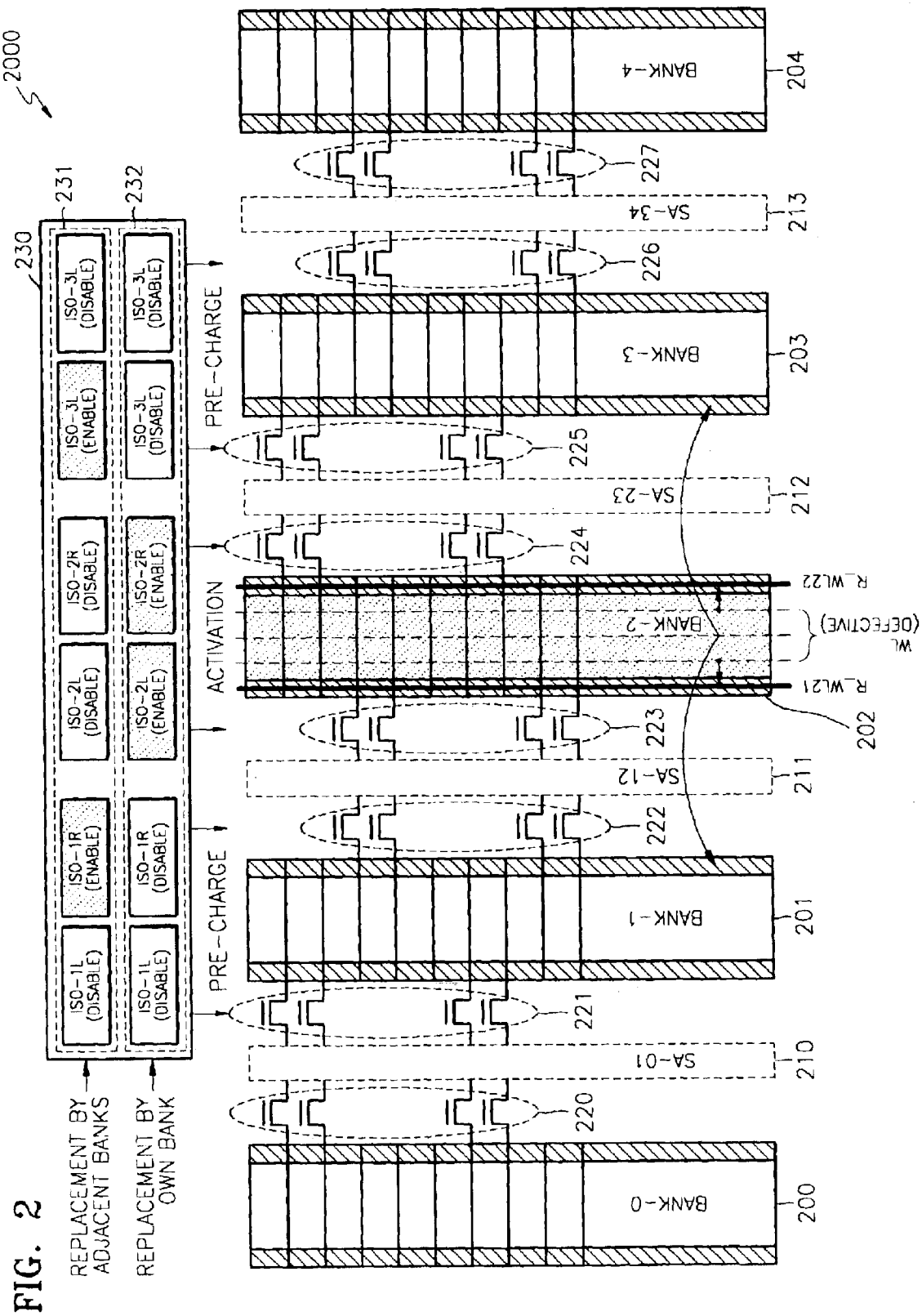
FIG. 2 shows a semiconductor memory device having a plurality of banks according to an exemplary embodiment of the present invention.

FIG. 2 illustrates an exemplary embodiment of a semiconductor memory device 2000 having a plurality of banks according to the present invention. The semiconductor memory device 2000 of FIG. 2 includes a plurality of banks 200, 201, 202, 203, and 204, a plurality of sense amplifiers 210, 211, 212, and 213, a plurality of switching circuits 220, 221, 222, 223, 224, 225, 226, and 227, and a control signal generator 230. The exemplary embodiment and the present invention are not limited to number of banks, sense amplifiers and switching circuit illustrated. That is, various other combinations of banks, sense amplifiers and switching circuits may be used to implement a semiconductor device according the present invention. Moreover, although the control signal generator 230 is illustrated as being one contiguous unit, separating the control signal generator into distinct units is well within the purview of the present invention.

Each of the banks 200, 201, 202, 203, and 204 has normal word lines and redundancy word lines. The sense amplifiers 210, 211, 212, and 213 are placed between the various banks, and two adjacent banks share one sense amplifier. That is, for example, the second bank 202 and the third bank 203 share the sense amplifier 212, and the first bank 201 and the second bank 202 share the sense amplifier 211.

Each of the switching circuits 220, 221, 222, 223, 224, 225, 226, and 227 is placed between a bank and a sense amplifier and transmits data on a bit line of the bank to the sense amplifier in response to a control signal. The control signal generator 230 generates a control signal used to control corresponding switching circuits and is functional in outputting the control signal to the corresponding switching circuits.

In the semiconductor memory device 2000 according to an embodiment of the present invention, defects occurring in normal word lines of an enabled bank can be restored by redundancy word liners of two adjacent banks as well as redundancy word lines of the enabled bank. Thus, replacement redundancy as compared to that of the conventional semiconductor memory device is increased at least twofold.

The operation of the semiconductor memory device 2000 according to an embodiment of the present invention will be described with reference to FIG. 2. The semiconductor memory device 2000 of FIG. 2 illustrates a case where two redundancy word lines are included in one bank. If the number of defective word lines is less than two, the defective word lines can be replaced by redundancy word lines in the same bank. Banks according the semiconductor device 2000 of the present invention may include normal word lines in excess of the two illustrated. Moreover, the semiconductor device 2000 of the present invention may include redundancy word lines in excess of the; two illustrated. Generally, the number of normal and redundancy word line will be dictated base upon manufacturing and size constraints related to the production semiconductor devices.

In conventional semiconductor devices, if three or more defective word lines occur in an enabled bank, i.e., in the second bank 102 of FIG. 1, replacement using redundancy word lines in the second bank 102 is impossible. However, according to exemplary embodiments of the present invention, even if three or more defective word lines occur in the enabled bank, the defective word lines can be replaced by redundancy word lines of the adjacent banks.

For example, assuming three defective word lines occur in the second bank 202, a first defective word line and a second defective word line can be replaced by redundancy word lines of the second bank 202. In the example shown, this effectively eliminates the onboard word line redundancy of the second bank 202.

However, according to an embodiment of the present invention, a third defective word line can be replaced by enabling redundancy word lines of adjacent banks, i.e., the first bank 201 and the third bank 203. In particular, if the third defective word line is replaced by enabling redundancy word lines R_WL12 and R_WL31 of the first bank 201 and the third bank 203, data with respect to the redundancy word line R_WL12 of the first bank 201 is output to a first sense amplifier 210 and a second sense amplifier 211, and the data with respect to the redundancy word line R_WL31 is output to a third sense amplifier 212 and a fourth sense amplifier 213. The enabling of the redundancy word lines may be done simultaneously.

In this case, the data should not be output to the first sense amplifier 210 and the fourth sense amplifier 213, but the data should be output to the second sense amplifier 211 and the third sense amplifier 212. Therefore, in this case, the control signal generator 230 outputs a control signal used to disable the switching circuits 221 and 226 adjacent to the first and fourth sense amplifiers 210 and 213, so as to intercept the data output to the first sense amplifier 210 and the fourth sense amplifier 213. In addition, the control signal generator 230 outputs a control signal used to enable the switching circuits 222 and 225, so as to output the data to the second sense amplifier 211 and the third sense amplifier 212.

Furthermore, as shown in FIG. 2(231), the second bank 202 in which a defective word line exists, should be intercepted, and thus the control signal generator 230 outputs a control signal used to disable the switching circuits 223 and 224 related to the second bank 202.

According to an exemplary embodiment of the present invention, if more defects than the number of redundancy word lines designated in each bank occur, when redundancy word lines remain in banks adjacent to the bank having the defects, replacement can be performed. Thus, even when the number of defective word lines in one bank exceeds the number of redundant word lines therein, restoring the defective word lines can be performed without increasing the size of a semiconductor memory chip.

If the number of defective word lines is less than two, the defective word lines can be replaced by redundancy word lines in the same bank. Thus, there is no need of using redundancy word lines in adjacent banks. For example, if two or less defected rows occur in the second bank 202 having two redundancy word lines, data are output to the adjacent second sense amplifier 211 and third sense amplifier 212. Thus, as shown in FIG. 2 (232), the control signal generator 230 generates a control signal used to enable the switching circuits 223 and 224, each of which is adjacent to the second sense amplifier 211 and the second bank 202, and the third sense amplifier 212 and the second bank 202. The control signal generator 230 disables the other switching circuits 221, 222, 225, and 226.

Figure 3:
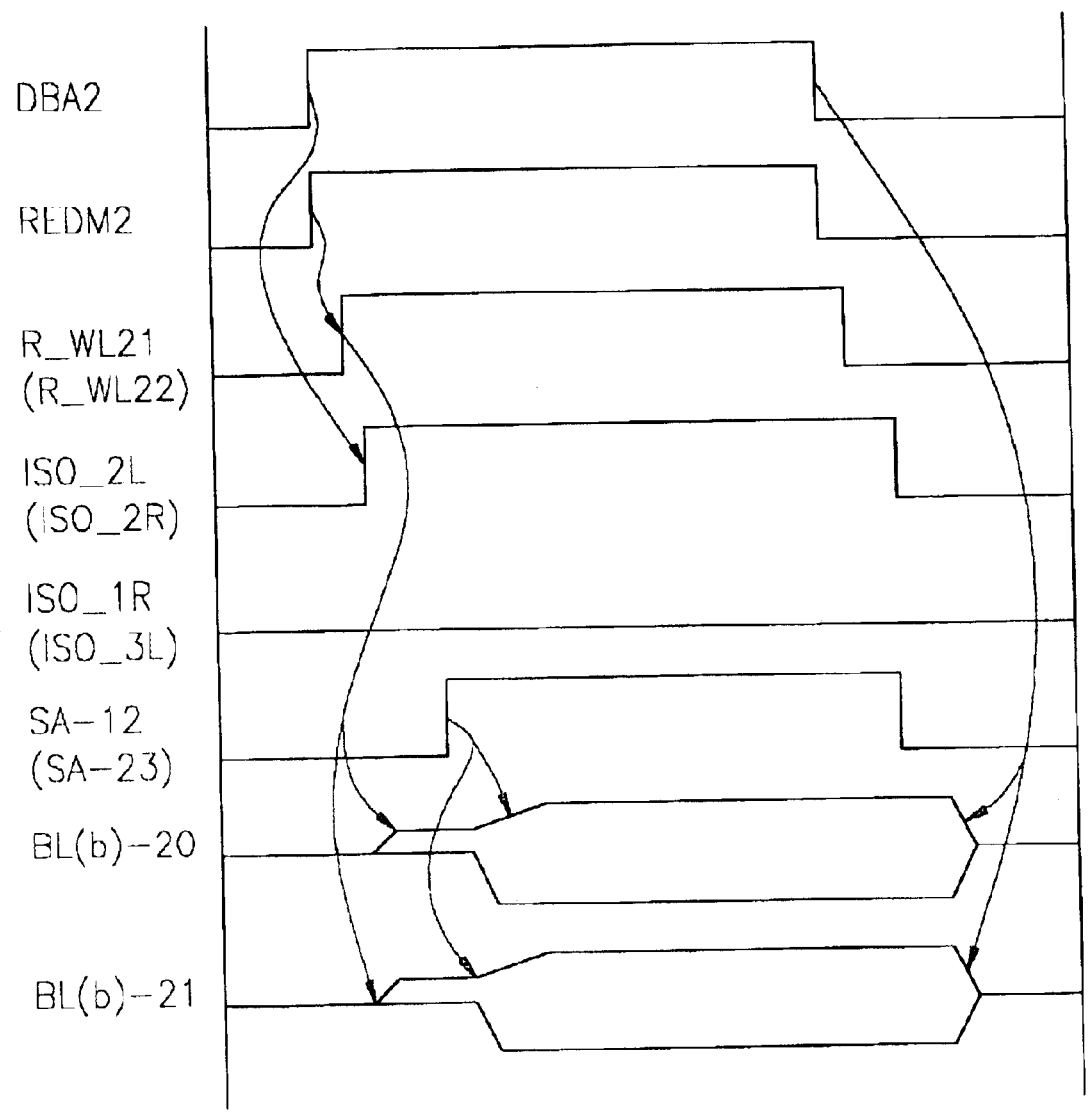
FIG. 3 is a timing diagram illustrating a case where a defected word line of a bank is replaced by redundancy word lines of the bank having the defected word line in a semiconductor memory device according to an exemplary embodiment of the present invention.
Figure 4:
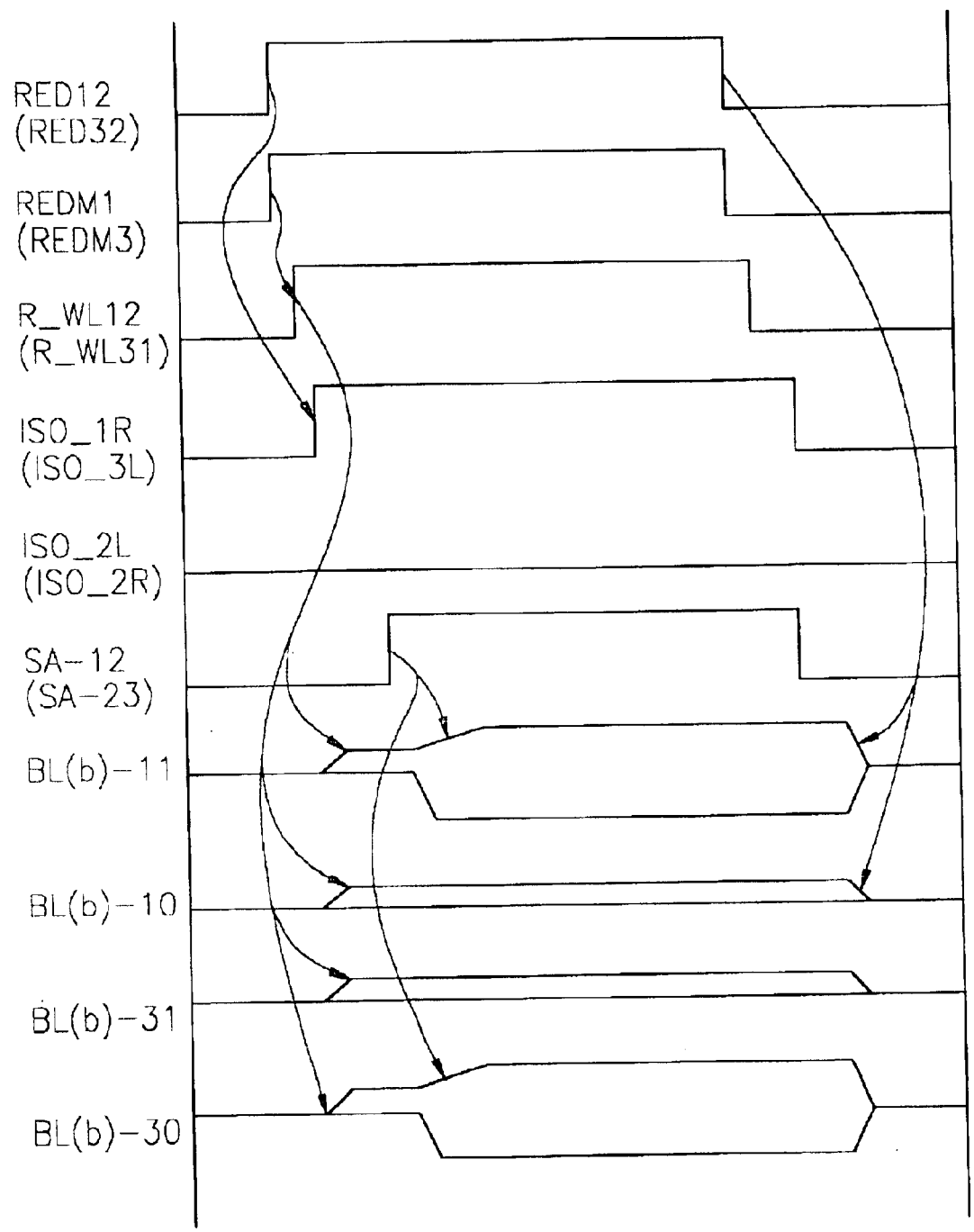
FIG. 4 is a timing diagram illustrating a case where a defected word line of a bank is replaced by redundancy word lines of banks adjacent to the bank having the defected word line in a semiconductor memory device according to an exemplary embodiment of the present invention.

FIG. 3 is a timing diagram illustrating a case where a defective word line of a bank is replaced by redundancy word lines of the bank having the defective word line. FIG. 4 is a timing diagram illustrating a case where a defected word line of a bank is replaced by redundancy word lines of banks adjacent to the bank having the defective word line, in accordance with a semiconductor memory device according to an exemplary embodiment of the present invention.

An operation of the semiconductor memory device according to an exemplary embodiment of the present invention will be described with reference to FIGS. 2 through 4. If a defective word line of a bank is replaced by redundancy word lines therein (i.e., the second bank 202) as shown in FIG. 3, a signal DBA2 used to select the second bank is enabled, and a redundancy word line selection signal REDM2 of the second bank 202 is enabled. A redundancy word line R_WL21 or R_WL22 of the second bank 202 is enabled in response to the redundancy word line selection signal REDM2 of the second bank 202, and output of data from bit lines BL(b)-20 and BL(b)-21 of the second bank 202 of FIG. 2 is prepared in response to the enabled redundancy word line R_WL21 or R_WL22 of the second bank 202.

The switching circuits 223 and 224 are enabled (signals ISO-2L and ISO-2R are enabled, as shown in FIG. 3) in response to the second bank selection signal DBA2, the second sense amplifier 211 and the third sense amplifier 212 are enabled in response to enable signals SA-12 and SA-23 of the second and third sense amplifiers 211 and 212, and data of the bit lines BL(b)-20 and BL(b)-21 are amplified and output. In this case, the switching circuits 222 and 225 are not enabled (signals ISO_1R and ISO_3L are not enabled, as shown in FIG. 3).

If a defected word line is replaced by redundancy word lines of two adjacent banks as shown in FIG. 4, control signals RED12 and RED32 which allow a defective word line of the second bank 202 to be replaced by redundancy word lines of the adjacent first and third banks 201 and 203 when the defected word line occurs in the second bank 202, are enabled. Moreover, redundancy word line selection signals REDM1 and REDM3 of the first bank 201 and the third bank 203 are enabled.

The redundancy word lines R_WL12 and R_WL31 of the first bank 201 and the third bank 203 are enabled in response to the redundancy word line selection signals REDM1 and REMD3, and output of data from bit lines BL(b)-10 and BL(b)-11 of the first bank 201 of FIG. 2 and bit lines BL(b)-30 and BL(b)-31 of the third bank 203 of FIG. 2 are prepared in response to the enabled redundancy word lines R_WL12 and R_WL31 of the first bank 201 and the third bank 202.

The control signals RED12 and RED32 are output by the control signal generator (231), and the switching circuits 222 and 225 are enabled (the signals ISO_1R and ISO_3L are enabled, as shown in FIG. 4) in response to the control signals RED12 and RED32. However, the switching circuits 223 and 224 adjacent to the second bank 202 are not enabled (the signals ISO_2L and ISO$_{13}$ 2R are not enabled, as shown in FIG. 4).

Data are amplified in the bit lines BL(b)-11 and BL(b)-30 and output in response to the enable signals SA-12 and SA-23 of the second and third sense amplifiers 211 and 212. When a defective word line is replaced by redundancy word lines of adjacent banks, as in an exemplary embodiment of the present invention, just the data on a side of the second bank 202 are useful. Thus, data on bit lines connected to sense amplifiers (i.e., the first sense amplifier 210 and the fourth sense amplifier 213 of FIG. 2) on opposite sides are shared, but are not amplified (see BL(b)-10 and BL(b)-31 of FIG. 4).

As described above, when a bank experiences more defective word lines than the number of redundancy word lines included therein, the semiconductor memory device according to the exemplary embodiment of the present invention can replace the defective word lines using the redundancy word lines of the two adjacent banks.

Thus, according to the exemplary embodiments of the present invention, efficiency of replacing defected word lines can be increased without increasing the size of a semiconductor memory chip.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device, comprising:
a plurality of banks, each bank having a plurality of normal word lines and a plurality of redundancy word lines, the plurality of redundancy word lines being for replacing the normal word lines as defects occur therein;
a plurality of sense amplifiers, each of the plurality of sense amplifiers being placed between adjacent banks of the plurality of banks, and which each sense and amplify data on a bit line of one of the plurality of banks; and
a plurality of switching circuits, each of the plurality of switching circuits being placed between one bank of the plurality of banks and a respective sense amplifier, and which transmits data on a bit line from one of the plurality of banks to a respective sense amplifier in response to a control signal,
wherein when a defective word line is replaced by redundancy word lines of two banks adjacent to a bank the defective word line is occurring in, the control signal is used to disable the switching circuits connected to the bank and enable each switching circuit connected to the adjacent banks that is between the bank and one of the adjacent banks, thereby the defective word line of the bank is replaced by the redundancy word lines of the two banks adjacent to the bank by enabling the redundancy word lines of the two banks adjacent to the bank.

2. The device of claim 1, wherein when the defective word line of the bank is replaced by the redundancy word lines thereof, the control signal is used to enable switching circuits connected to the bank and disable the switching circuits connected to banks adjacent to the bank.

3. The device of claim 1, wherein the control signal is produced by a control signal generator.

4. A semiconductor memory device, comprising:
a plurality of banks, each bank having normal word lines and redundancy word lines; and
a plurality of sense amplifiers, each of the plurality of sense amplifier being placed between adjacent banks of the plurality of banks,
wherein when a defective word line of a bank is replaced, redundancy word lines are used from banks being adjacent to the bank having the defective word line, the redundancy word lines of each of the banks adjacent to the bank being enabled, and each of the sense amplifiers being between the bank and each of the banks adjacent to the bank senses and amplifies data of redundancy word lines of each of the banks adjacent to the bank.

5. A semiconductor memory device, comprising:
a plurality of banks, each bank having normal word lines and redundancy word lines;
a plurality of sense amplifiers each of the plurality of sense amplifiers being positioned and functionally connected to adjacent banks of the plurality of banks;
a plurality of switching circuits, each switching circuit being placed between and functionally connected to each bank and each sense amplifier; and
a control signal generator for generating a control signal for at least the plurality of switching circuits, wherein when a defective word line of a bank is replaced, redundancy word lines of banks adjacent to the bank are utilized, the redundancy word lines of each of the banks adjacent to the bank are simultaneously enabled, and a corresponding switching circuit transmits data of the redundancy word lines of each of the banks adjacent to the bank to a corresponding sense amplifier in response to a corresponding control signal.

6. A semiconductor memory device comprising:

first, second, and third banks, each bank having normal word lines and redundancy word lines;

a first sense amplifier being positioned between the first bank and the second bank, the first sense amplifier for sensing and amplifying data on bit lines of the first and second banks in response to a first corresponding control signal; and a second sense amplifier being positioned between the first bank and the third bank, the second sense amplifier for sensing and amplifying data on bit lines of the first and third banks in response to a second corresponding control signal, wherein when a defective word line occurring when defects occur in the normal word lines of the first bank is replaced by redundancy word lines of the second and third banks, the redundancy word lines of the second bank and the redundancy word lines of the third bank are simultaneously activated, the first sense amplifier senses and amplifies data of the redundancy word lines of the second bank in response to the first control signal, and the second sense amplifier senses and amplifies data of the redundancy word lines of the third bank in response to the second control signal.

7. The device of claim 6, further comprising:

a fourth bank adjacent to the second bank, the fourth bank having normal word lines and redundancy word lines;

a fifth bank adjacent to the third bank, the fifth bank having normal word lines and redundancy word lines;

a third sense amplifier being placed between the second bank and the fourth bank, the third sense amplifier for sensing and amplifying data on bit lines of the second and fourth banks in response to a third corresponding control signal; and a fourth sense amplifier being placed between the third bank and the fifth bank, the fourth sense amplifier for sensing and amplifying data on bit lines of the third and fifth banks in response to a fourth corresponding control signal;

wherein the third and fourth sense amplifiers are deactivated in response to the third and fourth control signals.

8. A semiconductor device, comprising:

a plurality of banks having both word lines and redundancy word lines, the redundancy word lines of at least two banks being available for simultaneously replacing at least one defective word line of a bank being positioned between the at least two banks.

9. The semiconductor device according to claim 8, further comprising:

a plurality of sense amplifiers, one sense amplifier being positioned between a first bank of the at least two banks and the bank and another sense amplifier being positioned between a second bank of the at least two banks and the bank, the one sense amplifier being operationally connected to the first bank and the bank and the another sense amplifier being operationally connected to the second bank and the bank.

10. The semiconductor device according to claim 9, wherein the operational connections are performed by a plurality of switching circuits associated with each bank of the plurality of banks.

11. The semiconductor device according to claim 10, wherein each of the switching circuits is operationally connected with a control signal generator, the control signal generator being functional to enable or disable each of the switching circuits.

12. The semiconductor device according to claim 11, wherein by way of the one and the another sense amplifiers, at least several of the plurality of switching circuits and the control signal generator, the at least one defective word line of the bank is replaced by a redundancy word line from each of the at least two banks.

13. The semiconductor device according to claim 8, wherein a redundancy word line from each of the at least two banks is used to replace the at least one defective word line of the bank.

14. A method for providing word line redundancy, comprising:

detecting a word line fault in a bank; and replacing the defective word line using redundant word lines associated with a plurality of banks being adjacent to the bank.

15. The method according to claim 14, wherein replacing the defective word line includes obtaining access to a redundant word line in a first bank being adjacent to the bank and obtaining access to a redundant word line in a second bank being adjacent to the bank.

16. The method according to claim 14, further comprising disabling switching circuits in those banks having redundant word lines used by the bank.

17. The method according to claim 16, wherein the disabling of the switching circuits is controlled by way of a control signal generator.

18. A semiconductor device for performing the method according to claim 14.

19. The semiconductor device according to claim 18, comprising:

a plurality of banks having both word lines and redundancy word lines, the redundancy word lines of at least two banks being available for replacing at least one defective word line of a bank being positioned between the at least two banks.

* * * * *